United States Patent
Shi et al.

(10) Patent No.: US 12,203,553 B1
(45) Date of Patent: Jan. 21, 2025

(54) WEAR-RESISTANT AND LOW-FRICTION COATED PISTON RING AND PREPARATION METHOD THEREFOR

(71) Applicant: Asimco Shuanghuan Piston Ring (yizheng) Co., Ltd., Yizheng (CN)

(72) Inventors: Weiwei Shi, Yizheng (CN); Qianxi Liu, Yizheng (CN); Guanfei Shi, Yizheng (CN)

(73) Assignee: Asimco Shuanghuan Piston Ring (yizheng) Co., Ltd., Yizheng (CN)

( * ) Notice: Subject to any disclaimer, the term of this patent is extended or adjusted under 35 U.S.C. 154(b) by 0 days.

(21) Appl. No.: 18/623,057

(22) Filed: Apr. 1, 2024

(30) Foreign Application Priority Data

Feb. 1, 2024 (CN) .......................... 202410147549.7

(51) Int. Cl.
*F16J 9/26* (2006.01)
*C23C 14/02* (2006.01)
(Continued)

(52) U.S. Cl.
CPC ............... *F16J 9/26* (2013.01); *C23C 14/021* (2013.01); *C23C 14/0611* (2013.01); *C23C 14/35* (2013.01); *F16J 9/28* (2013.01)

(58) Field of Classification Search
CPC ... F16J 9/26; F16J 9/28; C23C 14/021; C23C 14/0611; C23C 14/35
See application file for complete search history.

(56) References Cited

U.S. PATENT DOCUMENTS

| | | | | |
|---|---|---|---|---|
| 2013/0334773 | A1* | 12/2013 | Lu | F16J 9/26 277/440 |
| 2015/0240944 | A1* | 8/2015 | Ivanov | F16J 9/26 427/580 |
| 2016/0305547 | A1* | 10/2016 | Avelar Araujo | F16J 9/26 |

FOREIGN PATENT DOCUMENTS

| | | |
|---|---|---|
| CN | 114875361 A | 8/2022 |
| EP | 3643805 A1 | 4/2020 |
| JP | 2013180501 A | 9/2013 |

OTHER PUBLICATIONS

Yanyan Lin, et al., Development of diamond-like carbon (DLC) coatings with alternate soft and hard multilayer architecture for enhancing wear performance at high contact stress, Surface & Coatings Technology, 2017, pp. 7-12, vol. 320.

(Continued)

*Primary Examiner* — Vishal A Patel
(74) *Attorney, Agent, or Firm* — Bayramoglu Law Offices LLC

(57) ABSTRACT

A wear-resistant and low-friction coated piston ring and a preparation method therefor are provided. The OD surface diamond-like carbon coating consists sequentially of a first metal interlayer, a second metal interlayer, a gradient DLC layer, alternating high/low hardness DLC layers, and an outer running-in DLC layer. The side surface diamond-like carbon coating consists sequentially of a metal interlayer, a gradient DLC layer, and alternating high/low hardness DLC layers. The preparation method employs physical vapor deposition to sequentially deposit composite DLC coatings on the OD surface and side surface of the piston ring. The coating is a tetrahedral amorphous carbon structure, exhibiting good thickness uniformity and fine grain structure. This improves the wear resistance of the piston ring's OD surface and side surface, reduces the aggressiveness of the piston (Continued)

ring side surface against the piston ring groove, and meanwhile avoids adhesion.

16 Claims, 2 Drawing Sheets

(51) Int. Cl.
  *C23C 14/06* (2006.01)
  *C23C 14/35* (2006.01)
  *F16J 9/28* (2006.01)

(56) References Cited

OTHER PUBLICATIONS

Yanchao Zhao, et al., Effect of the bias-graded increment on the tribological and electrochemical corrosion properties of DLC films, Diamond & Related Materials, 2022, pp. 1-9, vol. 130.
Gui-Gen Wang, et al., The preparation and evaluation of graded multilayer ta-C films deposited by FCVA method, Applied Surface Science, 2011, pp. 5064-5069, vol. 257.

\* cited by examiner

WEAR-RESISTANT AND LOW-FRICTION COATED PISTON RING AND PREPARATION METHOD THEREFOR

CROSS REFERENCE TO THE RELATED APPLICATIONS

This application is based upon and claims priority to Chinese Patent Application No. 202410147549.7, filed on Feb. 1, 2024, the entire contents of which are incorporated herein by reference.

TECHNICAL FIELD

The present invention relates to the technical field of piston ring surface treatment, in particular to a wear-resistant and low-friction coated piston ring and a preparation method therefor.

BACKGROUND

The fundamental driving force behind the development of engines is to improve fuel efficiency and meet increasingly stringent exhaust emission regulations. With the implementation of standards such as China VI, China VI B, and even higher emission standards, solutions like enhancing detonation pressure, increasing power, using low-viscosity (HTHS≤2.6) lubricating oil, matching steel pistons, and using green alternative fuels (natural gas, hydrogen, methanol, etc.) have become typical technical routes for high-end engines to reduce emissions and improve fuel efficiency. As one of the essential components of the engine, the piston ring operates in a harsh environment, posing significant challenges to its design and development. The working (operating) surface of the piston ring must ensure both wear resistance and resistance to cylinder scuffing under high-temperature, high-pressure, and low (or no) oil lubrication conditions, while also maintaining corrosion resistance under acidic and alkaline conditions. In such circumstances, the coating on the working surface of the piston ring, as a critical design element, inevitably becomes one of the main focuses for reducing frictional power losses and increasing reliability in the piston ring/cylinder liner and piston ring/piston friction pairs.

Currently, for the outer diameter (OD) surface of piston rings, the deposition of diamond-like carbon (DLC) coating is a research hotspot. However, DLC coating exhibits poor high-temperature resistance, as the diamond-like carbon phase tends to transform under high-temperature conditions. Additionally, with the increased thickness of the DLC coating, internal stress rises, leading to coating delamination. In other words, the current DLC coating still cannot meet the requirements of harsh working environments. For the side surface of piston rings, gas nitriding and side surface flash chrome (SFC) are the primary methods for strengthening the (lower) side surface of piston rings. Practical usage has revealed issues with gas nitriding, including poor corrosion resistance and a decrease in flexural strength after nitrogen infiltration into the matrix. The standard thickness of 0.005 mm/min for SFC is no longer sufficient to meet the strengthening and durability requirements of engines, and the 0.010 mm/min thickness standard is increasingly adopted by various engine models. Although increasing the thickness of the SFC layer can enhance durability, it simultaneously results in coarse and large grain size of the coating, leading to deterioration in roughness, straightness, waviness, etc. Polishing treatments cannot completely eliminate the large grains, leading to a decrease in the sealing performance of the piston ring side surface, causing excessive overall engine leakage.

Therefore, how to address the surface treatment of both the OD surface and side surface of the piston ring to meet the operating requirements in harsh working environments is currently a pressing issue that needs to be resolved.

SUMMARY

The objective of the present invention is to provide a wear-resistant and low-friction coated piston ring and a preparation method therefor, addressing issues such as coating delamination, high roughness, and unsuitability for harsh operating conditions that arise from current piston ring surface treatment processes.

To achieve the above-mentioned objective, the present invention provides the following technical solutions:

The present invention provides a wear-resistant and low-friction coated piston ring, including a piston ring matrix, an outer diameter (OD) surface diamond-like carbon coating, and a side surface diamond-like carbon coating, wherein the OD surface diamond-like carbon coating on an OD surface of the piston ring matrix consists, from bottom to top, of a first metal interlayer, a second metal interlayer, a gradient DLC layer, alternating high/low hardness DLC layers, and an outer running-in DLC layer;

the side surface diamond-like carbon coating on a side surface of the piston ring matrix consists, from bottom to top, of a metal interlayer, a gradient DLC layer, and alternating high/low hardness DLC layers.

Preferably, the alternating high/low hardness DLC layers in the OD surface diamond-like carbon coating and the side surface diamond-like carbon coating are arranged in a sequence of a low hardness DLC layer followed by a high hardness DLC layer in alternation.

Preferably, in the OD surface diamond-like carbon coating and the side surface diamond-like carbon coating, the low hardness DLC layer is adjacent to the gradient DLC layer.

Preferably, in the OD surface diamond-like carbon coating, the first metal interlayer is a chromium layer, and the second metal interlayer is a titanium layer; in the side surface diamond-like carbon coating, the metal interlayer is a titanium layer.

Preferably, in the OD surface diamond-like carbon coating, thickness of the first metal interlayer is in a range of 1.5 μm to 3 μm, and thickness of the second metal interlayer is in a range of 0.2 μm to 0.5 μm; in the side surface diamond-like carbon coating, thickness of the metal interlayer is in a range of 0.2 μm to 0.5 μm.

Preferably, in the OD surface diamond-like carbon coating, thickness of the gradient DLC layer is in a range of 0.3 μm to 0.9 μm, thickness of the alternating high/low hardness DLC layers is in a range of 18 μm to 32 μm, and thickness of the outer running-in DLC layer is in a range of 1.5 μm to 4 μm;

in the side surface diamond-like carbon coating, thickness of the gradient DLC layer is in a range of 0.3 μm to 0.9 μm, and thickness of the alternating high/low hardness DLC layers is in a range of 2 μm to 6 μm.

The present invention further provides a method for preparing the wear-resistant and low-friction coated piston ring, including the following steps:

(1) placing the piston ring matrix in vacuum coating equipment, heating and evacuating a chamber of the vacuum coating equipment; then introducing argon gas, and with the OD surface of the piston ring matrix as a surface to be coated, performing ion cleaning on the OD surface;

(2) using a chromium target as a cathode and argon gas as a reaction gas, and depositing the first metal interlayer on the OD surface after the ion cleaning;

(3) closing the chromium target, using a titanium target as a magnetron sputtering target and argon gas as a reaction gas, and depositing the second metal interlayer on the first metal interlayer;

(4) closing the titanium target, using a graphite target as a cathode and argon gas as a reaction gas, gradually increasing a negative bias voltage during deposition, and depositing the gradient DLC layer on the second metal interlayer;

(5) using a graphite target as a cathode, applying cyclically alternating high/low negative bias voltages during deposition, and depositing the alternating high/low hardness DLC layers on the gradient DLC layer;

(6) using a graphite target as a cathode, and applying cyclically alternating high/low negative bias voltages during deposition, with an absolute value of the high negative bias voltage in the high/low negative bias voltages lower than an absolute value of the high negative bias voltage in the high/low negative bias voltages from step (5), and an absolute value of the low negative bias voltage in the high/low negative bias voltages lower than an absolute value of the low negative bias voltage in the high/low negative bias voltages from step (5); depositing the outer running-in DLC layer on the alternating high/low hardness DLC layers, thus obtaining a piston ring with an OD surface diamond-like carbon coating;

(7) introducing air into the chamber of the vacuum coating equipment, and adjusting the position of the piston ring with the OD surface diamond-like carbon coating in the vacuum coating equipment; with the side surface as a surface to be coated, heating and evacuating the chamber of the vacuum coating equipment, then introducing argon gas, and performing ion cleaning on the side surface;

(8) using a titanium target as a magnetron sputtering target and argon gas as a reaction gas, and depositing the metal interlayer on the side surface after the ion cleaning; and (9) repeating steps (4) to (5), sequentially depositing the gradient DLC layer and the alternating high/low hardness DLC layers on the metal interlayer, thus obtaining the wear-resistant and low-friction coated piston ring.

Preferably, independent temperature for the heating in steps (1) and (7) is in a range of 100° C. to 150° C.;

independent vacuum degree for the evacuation in steps (1) and (7) is $5\times10^{-3}$ Pa;

independent conditions for the ion cleaning in steps (1) and (7) include: negative bias voltage in a range of −800 V to −1200 V, and ion cleaning time in a range of 90 minutes to 120 minutes.

Preferably, conditions for the deposition of the first metal interlayer in step (2) include: vacuum degree of $1\times10^{-3}$ Pa, cathode current in a range of 80 A to 120 A, negative bias voltage in a range of −17 V to −23 V, gas pressure in a range of 1 Pa to 2 Pa, and deposition time in a range of 55 minutes to 75 minutes;

independent conditions for the deposition of the second metal interlayer in step (3) and the deposition of the metal interlayer in step (8) include: vacuum degree of $1\times10^{-3}$ Pa, magnetron sputtering power in a range of 5 kW to 10 KW, negative bias voltage in a range of −100 V to −200 V, gas pressure in a range of 0.2 Pa to 2 Pa, and deposition time in a range of 50 minutes to 75 minutes.

Preferably, conditions for the deposition of the gradient DLC layer in step (4) include: vacuum degree of $1\times10^{-3}$ Pa, cathode current in a range of 80 A to 180 A, negative bias voltage uniformly increasing from −800 V to −2000 V during deposition, and deposition time in a range of 30 minutes to 80 minutes;

conditions for the deposition of the alternating high/low hardness DLC layers in step (5) include: vacuum degree of $1\times10^{-3}$ Pa, cathode current in a range of 80 A to 180 A, the cyclically alternating high/low negative bias voltages alternating in a cycle of 2 seconds to 3 seconds, the high negative bias voltage in the high/low negative bias voltages in a range of −1600 V to −2500 V, the low negative bias voltage in the high/low negative bias voltages in a range of −400 V to −1000 V, and deposition time in a range of 8 hours to 33 hours;

conditions for the deposition of the outer running-in DLC layer in step (6) include: vacuum degree of $1\times10^{-3}$ Pa, cathode current in a range of 80 A to 180 A, the cyclically alternating high/low negative bias voltages alternating in a cycle of 2 seconds to 3 seconds, the high negative bias voltage in the high/low negative bias voltages in a range of −1200 V to −2100 V, the low negative bias voltage in the high/low negative bias voltages in a range of −200 V to −600 V, and deposition time in a range of 1.8 hours to 4 hours.

It can be known from the above technical solutions that compared with the prior art, the present invention has the following beneficial effects:

The present invention employs a physical vapor deposition method to sequentially deposit high-wear-resistant and low-friction composite DLC coatings on the OD surface and side surface of the piston ring. The coating is of a tetrahedral amorphous carbon structure (ta-C). The composite DLC coating exhibits good thickness uniformity on the deposited OD surface and side surface, fine grain structure, excellent heat resistance, and subsequent processing can achieve a reduced surface peak height Rpk value. This improves the wear resistance of the piston ring's OD surface and side surface, reduces the aggressiveness of the piston ring side surface against the piston ring groove, and at the same time avoids adhesion between the piston ring and the piston ring groove.

In the OD surface coating mentioned above, the design of a dual interlayer structure with the first metal interlayer and the second metal interlayer not only ensures good adherence performance between the coating and the matrix but also significantly enhances the heat resistance of the coating. The gradient DLC layer further improves the adherence performance of the coating. The alternating high/low hardness DLC layers effectively reduce the internal stress from coating deposition, ensuring an increase in coating thickness. The outer running-in DLC layer not only ensures the subsequent processability of the coating but also enhances the running-in performance of the piston ring during initial use.

BRIEF DESCRIPTION OF THE DRAWINGS

In order to provide a clearer understanding of the embodiments of the present invention or the technical solutions in the prior art, a brief introduction will be given to the accompanying drawings used in the description of the embodiments or the prior art.

DETAILED DESCRIPTION OF THE EMBODIMENTS

Figure 1:
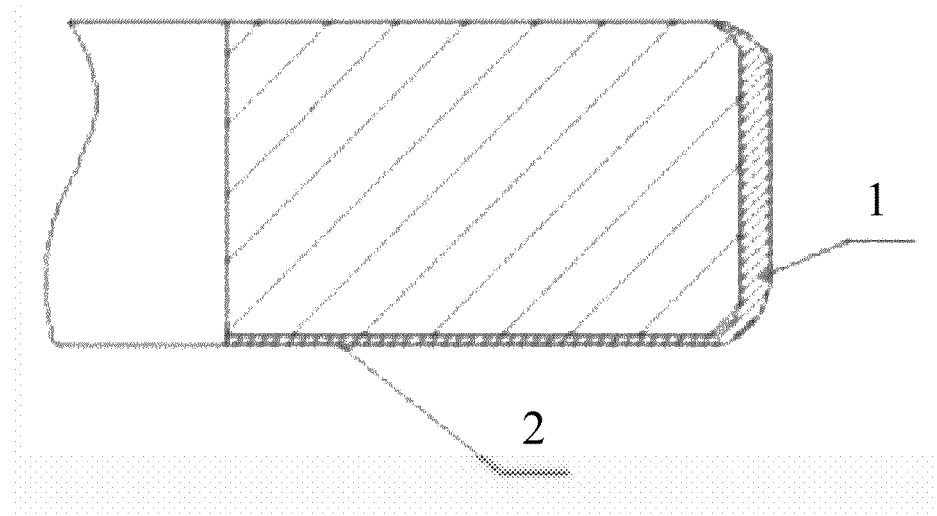
FIG. 1 is a schematic cross-sectional view of the wear-resistant and low-friction coated piston ring of the present invention, in which 1 represents the OD surface diamond-like carbon coating, and 2 represents the side surface diamond-like carbon coating.

The present invention provides a wear-resistant and low-friction coated piston ring. The wear-resistant and low-friction coated piston ring includes a piston ring matrix, an OD surface diamond-like carbon coating, and a side surface diamond-like carbon coating.

In the present invention, the OD surface diamond-like carbon coating on the OD surface of the piston ring matrix consists, from bottom to top, of a first metal interlayer, a second metal interlayer, a gradient DLC layer, alternating high/low hardness DLC layers, and an outer running-in DLC layer.

In the present invention, the side surface diamond-like carbon coating on the side surface of the piston ring matrix consists, from bottom to top, of a metal interlayer, a gradient DLC layer, and alternating high/low hardness DLC layers.

In the present invention, the alternating high/low hardness DLC layers in the OD surface diamond-like carbon coating and the side surface diamond-like carbon coating are preferably arranged in a sequence of a low hardness DLC layer followed by a high hardness DLC layer in alternation.

In the present invention, in the OD surface diamond-like carbon coating and the side surface diamond-like carbon coating, the low hardness DLC layer is adjacent to the gradient DLC layer.

In the present invention, in the OD surface diamond-like carbon coating, the first metal interlayer is preferably a chromium layer, and the second metal interlayer is preferably a titanium layer; in the side surface diamond-like carbon coating, the metal interlayer is preferably a titanium layer.

In the present invention, in the OD surface diamond-like carbon coating, the preferred thickness of the first metal interlayer is in a range of 1.5 μm to 3 μm; the preferred thickness of the second metal interlayer is in a range of 0.2 μm to 0.5 μm; the preferred thickness of the gradient DLC layer is in a range of 0.3 μm to 0.9 μm; the preferred thickness of the alternating high/low hardness DLC layers is in a range of 18 μm to 32 μm; and the preferred thickness of the outer running-in DLC layer is in a range of 1.5 μm to 4 μm.

In the present invention, in the side surface diamond-like carbon coating, the preferred thickness of the metal interlayer is in a range of 0.2 μm to 0.5 μm; the preferred thickness of the gradient DLC layer is in a range of 0.3 μm to 0.9 μm; and the preferred thickness of the alternating high/low hardness DLC layers is in a range of 2 μm to 6 μm.

In the present invention, the preferred material for the piston ring matrix is stainless steel.

In the present invention, the piston ring matrix is a piston ring that has undergone nitriding treatment. The nitriding treatment method is as follows: Ultrasonically clean and degrease the piston ring matrix, then hang the dried piston ring matrix in a nitriding furnace to heat up, with a heating time of 60 minutes. After reaching the desired temperature, the first nitriding stage begins, with an ammonia decomposition rate of 50%, a temperature of 540° C., and a holding time of 3 hours. Subsequently, the second nitriding stage takes place with an ammonia decomposition rate of 80%, a temperature of 580° C., and a holding time of 5 hours. The process concludes with cooling to room temperature, thus completing the nitriding treatment. The piston ring matrices used in the following embodiments of the present invention are all piston rings that have undergone the nitriding treatment described above.

The present invention further provides a method for preparing the wear-resistant and low-friction coated piston ring, including the following steps:

(1) placing the piston ring matrix in vacuum coating equipment, heating and evacuating a chamber of the vacuum coating equipment; then introducing argon gas, and with the OD surface of the piston ring matrix as the surface to be coated, performing ion cleaning on the OD surface;

(2) using a chromium target as a cathode and argon gas as a reaction gas, and depositing the first metal interlayer on the OD surface after the ion cleaning;

(3) closing the chromium target, using a titanium target as a magnetron sputtering target and argon gas as a reaction gas, and depositing the second metal interlayer on the first metal interlayer;

(4) closing the titanium target, using a graphite target as a cathode and argon gas as a reaction gas, gradually increasing a negative bias voltage during deposition, and depositing the gradient DLC layer on the second metal interlayer;

(5) using a graphite target as a cathode, applying cyclically alternating high/low negative bias voltages during deposition, and depositing the alternating high/low hardness DLC layers on the gradient DLC layer;

(6) using a graphite target as a cathode, and applying cyclically alternating high/low negative bias voltages during deposition, with an absolute value of the high negative bias voltage in the high/low negative bias voltages lower than an absolute value of the high negative bias voltage in the high/low negative bias voltages from step (5), and an absolute value of the low negative bias voltage in the high/low negative bias voltages lower than an absolute value of the low negative bias voltage in the high/low negative bias voltages from step (5); depositing the outer running-in DLC layer on the alternating high/low hardness DLC layers, thus obtaining a piston ring with an OD surface diamond-like carbon coating;

(7) introducing air into the chamber of the vacuum coating equipment, and adjusting the position of the piston ring with the OD surface diamond-like carbon coating in the vacuum coating equipment; with the side surface as the surface to be coated, heating and evacuating the chamber of the vacuum coating equipment, then introducing argon gas, and performing ion cleaning on the side surface;

(8) using a titanium target as a magnetron sputtering target and argon gas as a reaction gas, and depositing the metal interlayer on the side surface after the ion cleaning; and (9) repeating steps (4) to (5), sequentially depositing the gradient DLC layer and the alternating high/low hardness DLC layers on the metal interlayer, thus obtaining the wear-resistant and low-friction coated piston ring.

In the present invention, the piston ring matrix, before use, also undergoes a pretreatment. The pretreatment involves ultrasonic cleaning to remove impurities such as grease and dirt from the surface of the piston ring matrix. The present invention does not impose any limitation on the conditions for ultrasonic cleaning and conventional methods in the art may be employed.

In the present invention, the vacuum coating equipment mentioned in step (1) is conventional equipment in the art, equipped with both vacuum arc ion plating and magnetron sputtering deposition capabilities. The present invention does not impose any limitation on the equipment.

In the present invention, the independent temperature for the heating in steps (1) and (7) is preferably in a range of 100° C. to 150° C., further preferably in a range of 110° C. to 140° C., and even more preferably at 120° C.

In the present invention, the independent vacuum degree for the evacuation in steps (1) and (7) is preferably $5 \times 10^{-3}$ Pa.

In the present invention, the independent conditions for the ion cleaning in steps (1) and (7) are as follows: The preferred negative bias voltage is in a range of −800 V to −1200 V, further preferred in a range of −900 V to −1100 V, and even more preferred-1000 V; the preferred ion cleaning time is in a range of 90 minutes to 120 minutes, further preferred in a range of 95 minutes to 110 minutes, and even more preferred 105 minutes.

In the present invention, the conditions for the deposition of the first metal interlayer in step (2) are as follows: The preferred vacuum degree is $1 \times 10^{-3}$ Pa; the preferred cathode current is in a range of 80 A to 120 A, further preferred in a range of 90 A to 115 A, and even more preferred 110 A; the preferred negative bias voltage is in a range of −17 V to −23 V, further preferred-19 V to −22 V, and even more preferred-21 V; the preferred gas pressure is in a range of 1 Pa to 2 Pa, further preferred in a range of 1.2 Pa to 1.7 Pa, and even more preferred 1.5 Pa; the preferred deposition time is in a range of 55 minutes to 75 minutes, further preferred in a range of 65 minutes to 72 minutes, and even more preferred 70 minutes.

In the present invention, the independent conditions for the deposition of the second metal interlayer in step (3) and the deposition of the metal interlayer in step (8) are as follows: The preferred vacuum degree is $1 \times 10^{-3}$ Pa; the preferred magnetron sputtering power is in a range of 5 kW to 10 KW, further preferred in a range of 6 kW to 9 KW, and even more preferred 8 kW; the preferred negative bias voltage is in a range of −100 V to −200 V, further preferred in a range of −130 V to −170 V, and even more preferred-160 V; the preferred gas pressure is in a range of 0.2 Pa to 2 Pa, further preferred in a range of 0.6 Pa to 1.5 Pa, and even more preferred 1 Pa; the preferred deposition time is in a range of 55 minutes to 75 minutes, further preferred in a range of 58 minutes to 72 minutes, and even more preferred 65 minutes.

In the present invention, the conditions for the deposition of the gradient DLC layer in step (4) are as follows: The preferred vacuum degree is $1 \times 10^{-3}$ Pa; the preferred cathode current is in a range of 80 A to 180 A, further preferred in a range of 85 A to 140 A, and even more preferred 120 A; preferably the negative bias voltage is uniformly increased from −800 V to −2000 V during deposition; the preferred deposition time is in a range of 30 minutes to 80 minutes, further preferred in a range of 55 minutes to 70 minutes, and even more preferred 60 minutes.

In the present invention, the conditions for the deposition of the alternating high/low hardness DLC layers in step (5) are as follows: The preferred vacuum degree is $1 \times 10^{-3}$ Pa; the preferred cathode current is in a range of 80 A to 180 A, further preferred in a range of 100 A to 170 A, and even more preferred 150 A; the cyclically alternating high/low negative bias voltages alternate preferably in a cycle of 2 seconds to 3 seconds, and further preferably 3 seconds; the preferred high negative bias voltage in the high/low negative bias voltage is in a range of −1600 V to −2500 V, further preferred in a range of −1780 V to −2300 V, and even more preferred-2200 V; the preferred low negative bias voltage in the high/low negative bias voltage is in a range of −400 V to −1000 V, further preferred in a range of −670 V to −870 V, and even more preferred-750 V; the preferred deposition time is in a range of 8 hours to 33 hours, further preferred in a range of 24 hours to 30 hours, and even more preferred 26 hours.

In the present invention, the conditions for the deposition of the outer running-in DLC layer in step (6) are as follows: The preferred vacuum degree is $1 \times 10^{-3}$ Pa; the preferred cathode current is in a range of 80 A to 180 A, further preferred in a range of 100 A to 170 A, and even more preferred 150 A; the cyclically alternating high/low negative bias voltages alternate preferably in a cycle of 2 seconds to 3 seconds, and further preferably 2 seconds; the preferred high negative bias voltage in the high/low negative bias voltage is in a range of −1200 V to −2100 V, further preferred in a range of −1300 V to −1700 V, and even more preferred-1600 V; the preferred low negative bias voltage in the high/low negative bias voltage is in a range of −200 V to −600 V, further preferred in a range of −300 V to −500 V, and even more preferred-400 V; the preferred deposition time is in a range of 1.8 hours to 4 hours, further preferred in a range of 2 hours to 4 hours, and even more preferred 3 hours.

The technical solutions in the embodiments of the present invention will be clearly and completely described below. Apparently, the described embodiments are merely a part, rather than all of the embodiments of the present invention. Based on the embodiments of the present invention, all other embodiments obtained by those of ordinary skill in the art without creative efforts shall fall within the protection scope of the present invention.

Embodiment 1

The embodiment provides a wear-resistant and low-friction coated piston ring. The piston ring includes a piston ring matrix, an OD surface diamond-like carbon coating, and a side surface diamond-like carbon coating.

The OD surface diamond-like carbon coating on the OD surface of the piston ring matrix consists, from bottom to top, of a 2.6 μm chromium layer, a 0.33 μm titanium layer, a 0.45 μm gradient DLC layer, 24.5 μm alternating high/low hardness DLC layers, and a 2.8 μm outer running-in DLC layer.

The side surface diamond-like carbon coating on the side surface of the piston ring matrix consists, from bottom to top, of a 0.33 µm titanium layer, a 0.3 µm gradient DLC layer, and 4.2 µm alternating high/low hardness DLC layers.

Figure 2:
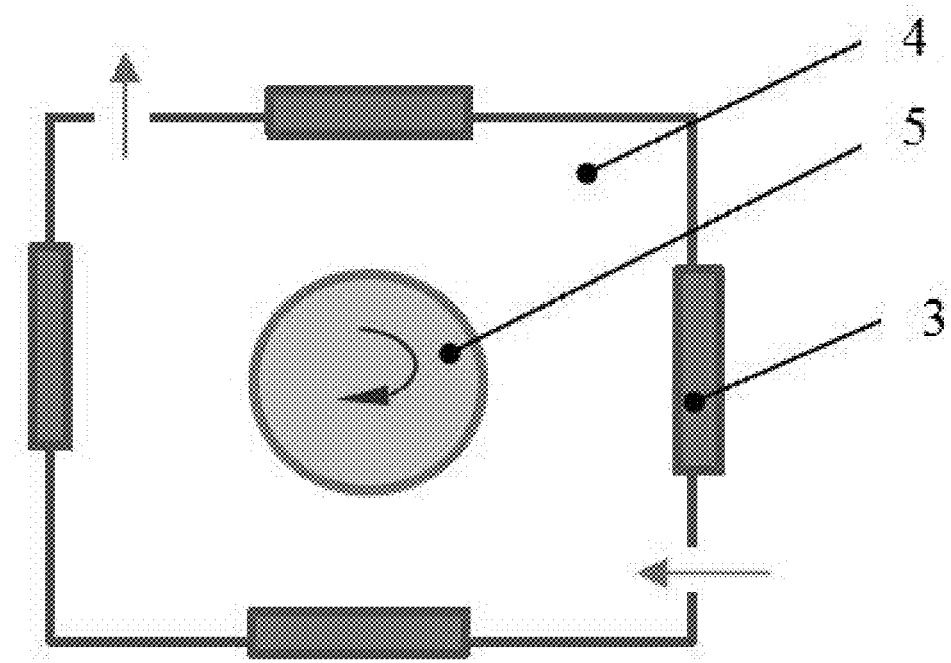
FIG. 2 is a schematic top view of the piston ring matrix in the vacuum coating equipment during the deposition of the OD surface diamond-like carbon coating according to Embodiment 1, in which 3 represents the cathode, 4 represents the chamber of the vacuum coating equipment, and 5 represents the piston ring matrix.

The preparation method for the above-mentioned wear-resistant and low-friction coated piston ring includes the following steps:

(1) Place the piston ring matrix, which has been ultrasonically cleaned and dried, in vacuum coating equipment, as shown in FIG. 2. Heat and evacuate the chamber of the vacuum coating equipment. When the temperature reaches 150° C. and the vacuum degree reaches $5\times 10^{-3}$ Pa, introduce 99.99% pure argon gas. With the OD surface of the piston ring matrix as the surface to be coated, apply a negative bias voltage of −1000 V for ion cleaning of the OD surface for 110 minutes.

(2) When the vacuum degree drops to $1\times 10^{-3}$ Pa, use a chromium target as the cathode and argon gas as the reaction gas, set the cathode current to 100 A and gas pressure to 1 Pa, and apply a negative bias voltage of −20 V. Deposit a chromium layer on the OD surface after the ion cleaning, with the deposition time being 65 minutes.

(3) Close the chromium target. When the vacuum degree drops to $1\times 10^{-3}$ Pa, use a titanium target as the magnetron sputtering target and argon gas as the reaction gas, set the sputtering power to 8 kW and gas pressure to 1 Pa, and apply a negative bias voltage of −200 V. Deposit a titanium layer on the chromium layer, with the deposition time being 60 minutes.

(4) Close the titanium target. When the vacuum degree drops to $1\times 10^{-3}$ Pa, use a graphite target as the cathode, set the cathode current to 130 A, and uniformly increase the negative bias voltage from −800 V to −2000 V within 60 minutes. Deposit a gradient DLC layer on the titanium layer, with the deposition time being 60 minutes.

(5) When the vacuum degree drops to $1\times 10^{-3}$ Pa, use a graphite target as the cathode, and set the cathode current to 145 A. During the deposition, apply alternating high/low negative bias voltages in a 2-second cycle, with the high negative bias voltage being −2100 V and the low negative bias voltage being −800 V. Deposit alternating high/low hardness DLC layers on the gradient DLC layer, with the deposition time being 25 hours.

(6) When the vacuum degree drops to $1\times 10^{-3}$ Pa, use a graphite target as the cathode, and set the cathode current to 145 A. During the deposition, apply alternating high/low negative bias voltages in a 2-second cycle, with the high negative bias voltage being −1700 V and the low negative bias voltage being −400 V. Deposit an outer running-in DLC layer on the alternating high/low hardness DLC layers, with the deposition time being 3.5 hours, thus obtaining a piston ring with an OD surface diamond-like carbon coating.

Figure 3:
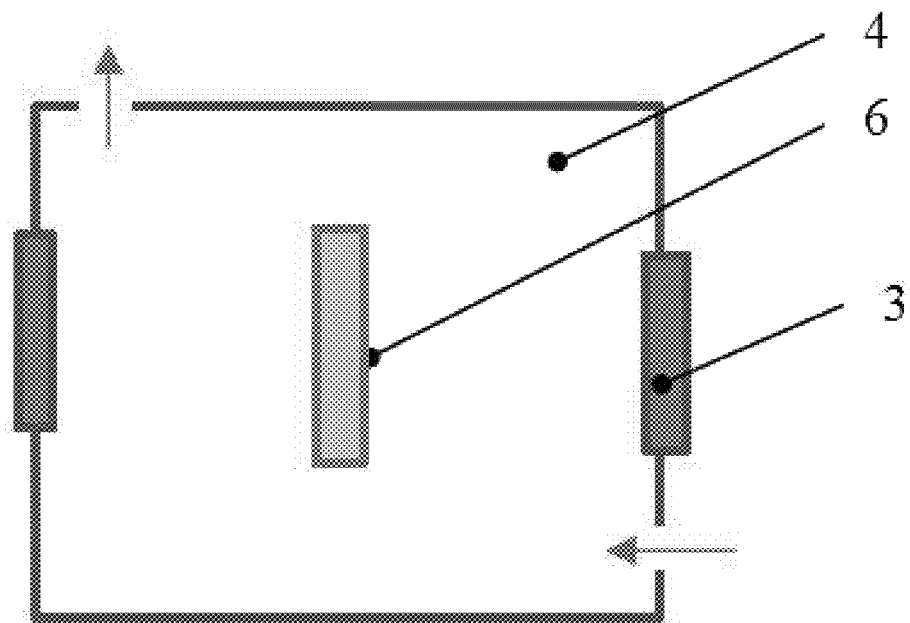
FIG. 3 is a schematic front view of the piston ring with the OD surface diamond-like carbon coating in the vacuum coating equipment during the deposition of the side surface diamond-like carbon coating according to Embodiment 1, in which 6 represents the piston ring with the OD surface diamond-like carbon coating.

(7) Introduce air into the chamber of the vacuum coating equipment. Adjust the position of the piston ring with the OD surface diamond-like carbon coating in the vacuum coating equipment, as shown in FIG. 3. Use the side surface as the coating surface. Heat and evacuate the chamber of the vacuum coating equipment. When the temperature reaches 150° C. and the vacuum degree reaches $5\times 10^{-3}$ Pa, introduce 99.99% pure argon gas and ion-clean the side surface for 110 minutes.

(8) When the vacuum degree drops to $1\times 10^{-3}$ Pa, use a titanium target as the magnetron sputtering target and argon gas as the reaction gas, set the magnetron sputtering power to 8 kW and gas pressure to 1 Pa, and apply a negative bias voltage of −200 V. Deposit a titanium layer on the side surface after the ion cleaning, with the deposition time being 60 minutes.

(9) Close the titanium target. When the vacuum degree drops to $1\times 10^{-3}$ Pa, use a graphite target as the cathode, set the cathode current to 130 A, and uniformly increase the negative bias voltage from −800 V to −2000 V within 35 minutes. Deposit a gradient DLC layer on the titanium layer, with the deposition time being 35 minutes.

(10) When the vacuum degree drops to $1\times 10^{-3}$ Pa, use a graphite target as the cathode, and set the cathode current to 145 A. During the deposition, apply alternating high/low negative bias voltages in a 2-second cycle, with the high negative bias voltage being −1700 V and the low negative bias voltage being −400 V. Deposit alternating high/low hardness DLC layers on the gradient DLC layer, with the deposition time being 12 hours, thus obtaining the wear-resistant and low-friction coated piston ring.

The hardness of the OD surface diamond-like carbon coating on the wear-resistant and low-friction coated piston ring manufactured through the above-mentioned process is 2230 HV, with a surface roughness of Ra1.9 and a friction coefficient of 0.09. The hardness of the side surface diamond-like carbon coating is 2050 HV, with a surface roughness of Ra1.9 and a friction coefficient of 0.09.

Embodiment 2

The embodiment provides a wear-resistant and low-friction coated piston ring. The piston ring includes a piston ring matrix, an OD surface diamond-like carbon coating, and a side surface diamond-like carbon coating.

The OD surface diamond-like carbon coating on the OD surface of the piston ring matrix consists, from bottom to top, of a 2.6 µm chromium layer, a 0.33 µm titanium layer, a 0.45 µm gradient DLC layer, 19.4 µm alternating high/low hardness DLC layers, and a 2.8 µm outer running-in DLC layer.

The side surface diamond-like carbon coating on the side surface of the piston ring matrix consists, from bottom to top, of a 0.33 µm titanium layer, a 0.3 µm gradient DLC layer, and 5.7 µm alternating high/low hardness DLC layers.

Specific details of the preparation method for the above-mentioned wear-resistant and low-friction coated piston ring can be found in Embodiment 1. The difference lies in step (5), where the cathode current is set to 90 A; during the deposition, alternating high/low negative bias voltages are applied in a 3-second cycle, with the high negative bias voltage being −1900 V and the low negative bias voltage being −650 V; and alternating high/low hardness DLC layers are deposited on the gradient DLC layer, with the deposition time being 21 hours. The difference also lies in step (10), where the cathode current is set to 160 A; during the deposition, alternating high/low negative bias voltages are applied in a 2-second cycle, with the high negative bias voltage being −1800 V and the low negative bias voltage being −500 V; and alternating high/low hardness DLC layers are deposited on the gradient DLC layer, with the deposition time being 14.5 hours.

The hardness of the OD surface diamond-like carbon coating on the wear-resistant and low-friction coated piston ring manufactured through the above-mentioned process is 2212 HV, with a surface roughness of Ra1.9 and a friction coefficient of 0.098. The hardness of the side surface diamond-like carbon coating is 2065 HV, with a surface roughness of Ra1.8 and a friction coefficient of 0.092.

Embodiment 3

The embodiment provides a wear-resistant and low-friction coated piston ring. The piston ring includes a piston ring matrix, an OD surface diamond-like carbon coating, and a side surface diamond-like carbon coating.

The OD surface diamond-like carbon coating on the OD surface of the piston ring matrix consists, from bottom to top, of a 1.7 μm chromium layer, a 0.4 μm titanium layer, a 0.45 μm gradient DLC layer, 24.5 μm alternating high/low hardness DLC layers, and a 2.8 μm outer running-in DLC layer.

The side surface diamond-like carbon coating on the side surface of the piston ring matrix consists, from bottom to top, of a 0.33 μm titanium layer, a 0.3 μm gradient DLC layer, and 4.2 μm alternating high/low hardness DLC layers.

Specific details of the preparation method for the above-mentioned wear-resistant and low-friction coated piston ring can be found in Embodiment 1. The difference lies in step (2), where the cathode current is set to 90 A, gas pressure to 1 Pa, a negative bias voltage of −18 V is applied; and a chromium layer is deposited on the OD surface after ion cleaning, with the deposition time being 57 minutes. The difference also lies in step (3), where the sputtering power is set to 10 kW, gas pressure to 1 Pa, a negative bias voltage of −150 V is applied; and a titanium layer is deposited on the chromium layer, with the deposition time being 68 minutes.

The hardness of the OD surface diamond-like carbon coating on the wear-resistant and low-friction coated piston ring manufactured through the above-mentioned process is 2234 HV, with a surface roughness of Ra1.9 and a friction coefficient of 0.093. The hardness of the side surface diamond-like carbon coating is 2047 HV, with a surface roughness of Ra1.9 and a friction coefficient of 0.091.

Embodiment 4

The embodiment provides a wear-resistant and low-friction coated piston ring. The piston ring includes a piston ring matrix, an OD surface diamond-like carbon coating, and a side surface diamond-like carbon coating.

The OD surface diamond-like carbon coating on the OD surface of the piston ring matrix consists, from bottom to top, of a 2.6 μm chromium layer, a 0.33 μm titanium layer, a 0.45 μm gradient DLC layer, 24.5 μm alternating high/low hardness DLC layers, and a 3.5 μm outer running-in DLC layer.

The side surface diamond-like carbon coating on the side surface of the piston ring matrix consists, from bottom to top, of a 0.33 μm titanium layer, a 0.3 μm gradient DLC layer, and 2.7 μm alternating high/low hardness DLC layers.

Specific details of the preparation method for the above-mentioned wear-resistant and low-friction coated piston ring can be found in Embodiment 1. The difference lies in step (6), where the cathode current is set to 145 A; during the deposition, alternating high/low negative bias voltages are applied in a 3-second cycle, with the high negative bias voltage being −1900 V and the low negative bias voltage being −500 V; and an outer running-in DLC layer is deposited on the alternating high/low hardness DLC layers, with the deposition time being 4 hours. The difference also lies in step (10), where the cathode current is set to 90 A; during the deposition, alternating high/low negative bias voltages are applied in a 3-second cycle, with the high negative bias voltage being −1600 V and the low negative bias voltage being −400 V; and alternating high/low hardness DLC layers are deposited on the gradient DLC layer, with the deposition time being 8.5 hours.

The hardness of the OD surface diamond-like carbon coating on the wear-resistant and low-friction coated piston ring manufactured through the above-mentioned process is 2257 HV, with a surface roughness of Ra1.7 and a friction coefficient of 0.092. The hardness of the side surface diamond-like carbon coating is 2024 HV, with a surface roughness of Ra1.7 and a friction coefficient of 0.095.

Comparative Example 1

The comparative example provides a piston ring with an OD surface diamond-like carbon coating. It is deposited using a multi-arc ion coating method, and the coating, from bottom to top, includes a 0.2 μm chromium layer and a 24.5 μm DLC layer.

Comparative Example 2

The comparative example provides a piston ring with an OD surface CrMON coating. It is deposited using a multi-arc ion coating method, and the coating thickness is 24 μm.

Comparative Example 3

This comparative example provides a piston ring with a diamond-like carbon coating, as detailed in Embodiment 1. The difference lies in the absence of a diamond-like carbon coating on the side surface.

Comparative Example 4

This comparative example provides a piston ring with a diamond-like carbon coating, as detailed in Embodiment 1. The difference is that the OD surface diamond-like carbon coating does not include a titanium layer and an outer running-in DLC layer.

The wear-resistant and low-friction coated piston rings manufactured are subjected to friction and wear tests, aggressiveness tests against counter-grinding components, and heat resistance tests. Specifically, the OD surface coatings of the piston rings from Embodiment 1 and Comparative Examples 1 to 2 are subjected to friction and wear tests. The side surface coatings of the piston rings from Embodiment 1 and Comparative Example 3 are subjected to aggressiveness tests against counter-grinding components. The OD surface coatings of the piston rings from Embodiment 1 and Comparative Example 4 are subjected to heat resistance tests.

Figure 4:
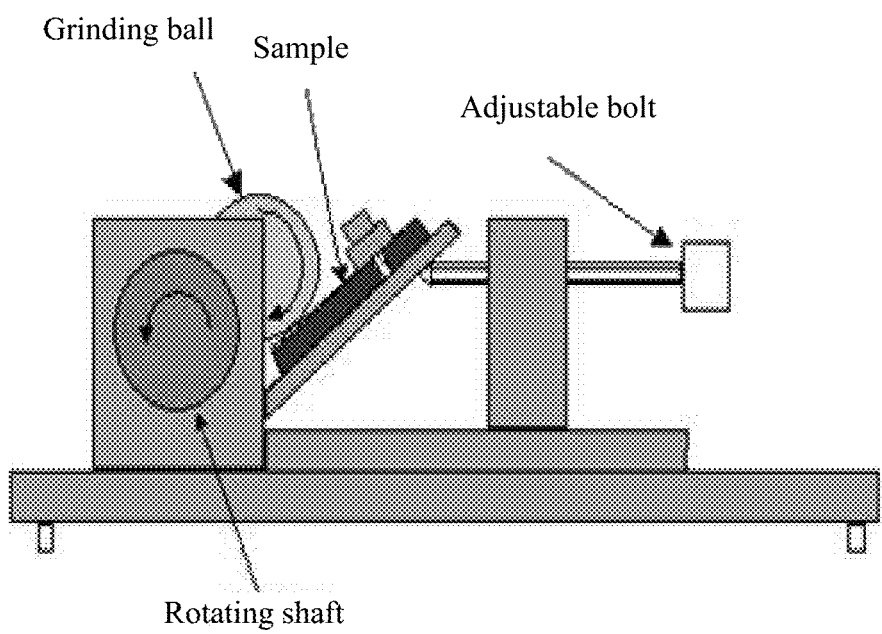
FIG. 4 is a schematic diagram of the pin on disc tribometer used in the friction and wear test.

The friction and wear testing method is as follows: A pin on disc tribometer as shown in FIG. 4 was used, and the counter-grinding ball is a WC—Co ball with a diameter of 30 mm, a rotating speed of 150 rpm, and the sample inclined at an angle of 60°. The diamond suspension was used as a polishing medium, with one drop applied to the contact surface between the counter-grinding ball and the piston ring. The results of the friction and wear tests are shown in Table 1. The method for testing the aggressiveness against counter-grinding components is as follows: A bench test was conducted for the durability of a specific diesel engine with a power of 551 kW, torque of 3500 N·m, detonation pressure of 25 MPa, and a test duration of 3000 hours. The results of the aggressiveness test against counter-grinding components are shown in Table 2. The heat resistance testing method is as follows: The piston rings were heated to 350° C. and kept insulated for 2 hours. Afterward, the piston rings were removed and allowed to cool in the air. The coatings were observed for their integrity and any signs of delamination. The results of the heat resistance test are shown in Table 3.

TABLE 1

Friction and Wear Test Results

| Sample | Test Time | Wear Depth |
|---|---|---|
| Embodiment 1 | 3600 s | 9.6 μm |
| Comparative Example 1 | 3600 s | 19.3 μm |
| Comparative Example 2 | 340 s | 35.1 μm |

TABLE 2

Results of Aggressiveness Test
Against Counter-Grinding Components

| Sample | Groove Wear Depth of Piston Ring |
|---|---|
| Embodiment 1 | 60 μm |
| Comparative Example 3 | 97 μm |

TABLE 3

Results of Heat Resistance Test

| Sample | coating Integrity after Test |
|---|---|
| Embodiment 1 | Intact coating without delamination |
| Comparative Example 4 | Local delamination of the coating |

The above descriptions are only preferred embodiments of the present invention. It should be noted that those of ordinary skill in the art can also make several improvements and modifications without departing from the principle of the present invention, and such improvements and modifications shall fall within the protection scope of the present invention.

What is claimed is:

1. A wear-resistant and low-friction coated piston ring, comprising a piston ring matrix, an outer diameter surface diamond-like carbon coating, and a side surface diamond-like carbon coating, wherein
the outer diameter surface diamond-like carbon coating on an outer diameter surface of the piston ring matrix comprises, from bottom to top, a first metal interlayer, a second metal interlayer, a gradient diamond-like carbon layer, alternating hardness diamond-like carbon layers, wherein a first hardness diamond-like carbon layer is a high hardness diamond-like carbon layer and a second hardness diamond-like carbon layer is a low hardness diamond-like carbon layer, and an outer running-in diamond-like carbon layer;
the side surface diamond-like carbon coating on a side surface of the piston ring matrix comprises, from bottom to top, a metal interlayer, the gradient diamond-like carbon layer, and the alternating hardness diamond-like carbon layers,
wherein in the outer diameter surface diamond-like carbon coating, a thickness of the gradient diamond-like carbon layer is in a range of 0.3 μm to 0.9 μm, a thickness of the alternating hardness diamond-like carbon layers is in a range of 18 μm to 32 μm, and a thickness of the outer running-in diamond-like carbon layer is in a range of 1.5 μm to 4 μm;
in the side surface diamond-like carbon coating, a thickness of the gradient diamond-like carbon layer is in a range of 0.3 μm to 0.9 μm, and a thickness of the alternating hardness diamond-like carbon layers is in a range of 2 μm to 6 μm.

2. The wear-resistant and low-friction coated piston ring according to claim 1, wherein the alternating hardness diamond-like carbon layers in the outer diameter surface diamond-like carbon coating and the side surface diamond-like carbon coating are arranged in a sequence of the low hardness diamond-like carbon layer followed by the high hardness diamond-like carbon layer in alternation.

3. The wear-resistant and low-friction coated piston ring according to claim 2, wherein in the outer diameter surface diamond-like carbon coating and the side surface diamond-like carbon coating, the low hardness diamond-like carbon layer is adjacent to the gradient diamond-like carbon layer.

4. The wear-resistant and low-friction coated piston ring according to claim 2, wherein in the outer diameter surface diamond-like carbon coating, the first metal interlayer is a chromium layer, and the second metal interlayer is a titanium layer; in the side surface diamond-like carbon coating, the metal interlayer is the titanium layer.

5. The wear-resistant and low-friction coated piston ring according to claim 2, wherein in the outer diameter surface diamond-like carbon coating, a thickness of the first metal interlayer is in a range of 1.5 μm to 3 μm, and a thickness of the second metal interlayer is in a range of 0.2 μm to 0.5 μm; in the side surface diamond-like carbon coating, a thickness of the metal interlayer is in a range of 0.2 μm to 0.5 μm.

6. A method for preparing the wear-resistant and low-friction coated piston ring as claimed in claim 1, comprising the following steps:
(1) placing the piston ring matrix in a vacuum coating equipment, heating and evacuating a chamber of the vacuum coating equipment; then introducing argon gas, and with the outer diameter surface of the piston ring matrix as a surface to be coated, performing an ion cleaning on the outer diameter surface of the piston ring matrix;
(2) using a chromium target as a cathode and the argon gas as a reaction gas, and depositing the first metal interlayer on the outer diameter surface of the piston ring matrix after the ion cleaning;
(3) closing the chromium target, using a titanium target as a magnetron sputtering target and the argon gas as the reaction gas, and depositing the second metal interlayer on the first metal interlayer;
(4) closing the titanium target, using a graphite target as the cathode and the argon gas as the reaction gas, gradually increasing a negative bias voltage during a deposition, and depositing the gradient diamond-like carbon layer on the second metal interlayer;
(5) using the graphite target as the cathode, applying first cyclically alternating high and low negative bias voltages during the deposition, and depositing the alternating hardness diamond-like carbon layers on the gradient diamond-like carbon layer;
(6) using the graphite target as the cathode, and applying second cyclically alternating high negative bias voltages and low negative bias voltages during the deposition, with an absolute value of a second high negative bias voltage in the second cyclically alternating high negative bias voltages and low negative bias voltages lower than an absolute value of a first high negative bias voltage in the first cyclically alternating high negative bias voltages and low negative bias voltages from step (5), and an absolute value of a second low negative bias voltage in the second cyclically alternating high negative bias voltages and low negative bias voltages lower than an absolute value of a first low negative bias voltage in the first cyclically alternating high negative bias voltages and low negative bias voltages from step (5); depositing the outer running-in diamond-like carbon layer on the alternating hardness diamond-like carbon layers, thus obtaining a piston ring with the outer diameter surface diamond-like carbon coating;

(7) introducing air into the chamber of the vacuum coating equipment, and adjusting a position of the piston ring with the outer diameter surface diamond-like carbon coating in the vacuum coating equipment; with the side surface of the piston ring matrix as the surface to be coated, heating and evacuating the chamber of the vacuum coating equipment, then introducing the argon gas, and performing the ion cleaning on the side surface of the piston ring matrix;

(8) using the titanium target as the magnetron sputtering target and the argon gas as the reaction gas, and depositing the metal interlayer on the side surface of the piston ring matrix after the ion cleaning; and (9) repeating steps (4) to (5), sequentially depositing the gradient diamond-like carbon layer and the alternating hardness diamond-like carbon layers on the metal interlayer, thus obtaining the wear-resistant and low-friction coated piston ring.

7. The method for preparing the wear-resistant and low-friction coated piston ring according to claim 6, wherein independent temperature for the heating in steps (1) and (7) is in a range of 100° C. to 150° C.;

independent vacuum degree for the evacuation in steps (1) and (7) is $5 \times 10^{-3}$ Pa;

independent conditions for the ion cleaning in steps (1) and (7) comprise: a negative bias voltage in a range of −800 V to −1200 V, and an ion cleaning time in a range of 90 minutes to 120 minutes.

8. The method for preparing the wear-resistant and low-friction coated piston ring according to claim 7, wherein conditions for a deposition of the first metal interlayer in step (2) comprise: a vacuum degree of $1 \times 10^{-3}$ Pa, a cathode current in a range of 80 A to 120 A, a negative bias voltage in a range of −17 V to −23 V, a gas pressure in a range of 1 Pa to 2 Pa, and a deposition time in a range of 55 minutes to 75 minutes;

independent conditions for a deposition of the second metal interlayer in step (3) and a deposition of the metal interlayer in step (8) comprise: a vacuum degree of $1 \times 10^{-3}$ Pa, a magnetron sputtering power in a range of 5 kW to 10 KW, a negative bias voltage in a range of −100 V to −200 V, a gas pressure in a range of 0.2 Pa to 2 Pa, and a deposition time in a range of 50 minutes to 75 minutes.

9. The method for preparing the wear-resistant and low-friction coated piston ring according to claim 6, wherein conditions for a deposition of the gradient diamond-like carbon layer in step (4) comprise: a vacuum degree of $1 \times 10^{-3}$ Pa, a cathode current in a range of 80 A to 180 A, a negative bias voltage uniformly increasing from −800 V to −2000 V during the deposition of the gradient diamond-like carbon layer, and a deposition time in a range of 30 minutes to 80 minutes;

conditions for a deposition of the alternating hardness diamond-like carbon layers in step (5) comprise: a vacuum degree of $1 \times 10^{-3}$ Pa, a cathode current in a range of 80 A to 180 A, the first cyclically alternating high negative bias voltages and low negative bias voltages alternating in a cycle of 2 seconds to 3 seconds, the first high negative bias voltage in the first cyclically alternating high negative bias voltages and low negative bias voltages in a range of −1600 V to −2500 V, the first low negative bias voltage in the first cyclically alternating high negative bias voltages and low negative bias voltages in a range of −400 V to −1000 V, and a deposition time in a range of 8 hours to 33 hours;

conditions for a deposition of the outer running-in diamond-like carbon layer in step (6) comprise: a vacuum degree of $1 \times 10^{-3}$ Pa, a cathode current in a range of 80 A to 180 A, the second cyclically alternating high negative bias voltages and low negative bias voltages alternating in a cycle of 2 seconds to 3 seconds, the second high negative bias voltage in the second cyclically alternating high negative bias voltages and low negative bias voltages in a range of −1200 V to −2100 V, the second low negative bias voltage in the second cyclically alternating high negative bias voltages and low negative bias voltages in a range of −200 V to −600 V, and a deposition time in a range of 1.8 hours to 4 hours.

10. The wear-resistant and low-friction coated piston ring according to claim 3, wherein in the outer diameter surface diamond-like carbon coating, a thickness of the first metal interlayer is in a range of 1.5 µm to 3 µm, and a thickness of the second metal interlayer is in a range of 0.2 µm to 0.5 µm; in the side surface diamond-like carbon coating, a thickness of the metal interlayer is in a range of 0.2 µm to 0.5 µm.

11. The method for preparing the wear-resistant and low-friction coated piston ring according to claim 6, wherein the alternating hardness diamond-like carbon layers in the outer diameter surface diamond-like carbon coating and the side surface diamond-like carbon coating are arranged in a sequence of a low hardness diamond-like carbon layer followed by a high hardness diamond-like carbon layer in alternation.

12. The method for preparing the wear-resistant and low-friction coated piston ring according to claim 11, wherein in the outer diameter surface diamond-like carbon coating and the side surface diamond-like carbon coating, the low hardness diamond-like carbon layer is adjacent to the gradient diamond-like carbon layer.

13. The method for preparing the wear-resistant and low-friction coated piston ring according to claim 11, wherein in the outer diameter surface diamond-like carbon coating, the first metal interlayer is a chromium layer, and the second metal interlayer is a titanium layer; in the side surface diamond-like carbon coating, the metal interlayer is the titanium layer.

14. The method for preparing the wear-resistant and low-friction coated piston ring according to claim 11, wherein in the outer diameter surface diamond-like carbon coating, a thickness of the first metal interlayer is in a range of 1.5 µm to 3 µm, and a thickness of the second metal interlayer is in a range of 0.2 µm to 0.5 µm; in the side surface diamond-like carbon coating, a thickness of the metal interlayer is in a range of 0.2 µm to 0.5 µm.

15. The method for preparing the wear-resistant and low-friction coated piston ring according to claim 6, in the outer diameter surface diamond-like carbon coating, a thickness of the gradient diamond-like carbon layer is in a range of 0.3 μm to 0.9 μm, a thickness of the alternating hardness diamond-like carbon layers is in a range of 18 μm to 32 μm, and a thickness of the outer running-in diamond-like carbon layer is in a range of 1.5 μm to 4 μm;

in the side surface diamond-like carbon coating, a thickness of the gradient diamond-like carbon layer is in a range of 0.3 μm to 0.9 μm, and a thickness of the alternating hardness diamond-like carbon layers is in a range of 2 μm to 6 μm.

16. The method for preparing the wear-resistant and low-friction coated piston ring according to claim 8, wherein conditions for a deposition of the gradient diamond-like carbon layer in step (4) comprise: a vacuum degree of $1 \times 10^{-3}$ Pa, a cathode current in a range of 80 A to 180 A, a negative bias voltage uniformly increasing from −800 V to −2000 V during the deposition of the gradient diamond-like carbon layer, and a deposition time in a range of 30 minutes to 80 minutes;

conditions for a deposition of the alternating hardness diamond-like carbon layers in step (5) comprise: a vacuum degree of $1 \times 10^{-3}$ Pa, a cathode current in a range of 80 A to 180 A, the first cyclically alternating high negative bias voltages and low negative bias voltages alternating in a cycle of 2 seconds to 3 seconds, the first high negative bias voltage in the first cyclically alternating high negative bias voltages and low negative bias voltages in a range of −1600 V to −2500 V, the first low negative bias voltage in the first cyclically alternating high negative bias voltages and low negative bias voltages in a range of −400 V to −1000 V, and a deposition time in a range of 8 hours to 33 hours;

conditions for a deposition of the outer running-in diamond-like carbon layer in step (6) comprise: a vacuum degree of $1 \times 10^{-3}$ Pa, a cathode current in a range of 80 A to 180 A, the second cyclically alternating high negative bias voltages and low negative bias voltages alternating in a cycle of 2 seconds to 3 seconds, the second high negative bias voltage in the second cyclically alternating high negative bias voltages and low negative bias voltages in a range of −1200 V to −2100 V, the second low negative bias voltage in the second cyclically alternating high negative bias voltages and low negative bias voltages in a range of −200 V to −600 V, and a deposition time in a range of 1.8 hours to 4 hours.

* * * * *